US00RE46666E

(19) United States
(12) Reissued Patent
Lee

(10) Patent Number: US RE46,666 E
(45) Date of Reissued Patent: Jan. 9, 2018

(54) PACKAGE BOARD HAVING INTERNAL TERMINAL INTERCONNECTION AND SEMICONDUCTOR PACKAGE EMPLOYING THE SAME

(71) Applicant: Jong-Joo Lee, Suwon-si (KR)

(72) Inventor: Jong-Joo Lee, Suwon-si (KR)

(73) Assignee: SAMSUNG ELECTRONICS CO., LTD. (KR)

(21) Appl. No.: 14/215,033

(22) Filed: Mar. 16, 2014

Related U.S. Patent Documents

Reissue of:
(64) Patent No.: 7,745,922
Issued: Jun. 29, 2010
Appl. No.: 11/424,605
Filed: Jun. 16, 2006

(30) Foreign Application Priority Data

Jan. 19, 2006 (KR) ..... 10-2006-0005803

(51) Int. Cl.
*H01L 23/52* (2006.01)
*H01L 23/043* (2006.01)
*H01L 23/31* (2006.01)

(52) U.S. Cl.
CPC ..... *H01L 23/043* (2013.01); *H01L 23/3128* (2013.01)

(58) Field of Classification Search
CPC ..... H01L 23/49827; H01L 23/3128; H01L 23/49833; H01L 2924/01079; H01L 2924/15312; H01L 25/0657
(Continued)

(56) References Cited

U.S. PATENT DOCUMENTS 6,008,534 A * 12/1999 Fulcher ..... 257/691
6,111,317 A * 8/2000 Okada et al. ..... 257/737
(Continued)

FOREIGN PATENT DOCUMENTS

JP 5-206218 8/1993
JP H05206218 A 8/1993
(Continued)

OTHER PUBLICATIONS

Gu-Sung Kim, "3D/2.5D TSV Interposer—Process and Application", EPWorks Co., Ltd. Korea, SematechSymposium Korea, Oct. 24, 2012, pp. 1-35.
(Continued)

*Primary Examiner* — Tuan H Nguyen
(74) *Attorney, Agent, or Firm* — Renaissance IP Law Group LLP

(57) ABSTRACT

A package board is provided. The package board includes a board body having a front surface and a back surface. A first power pad, a first ground pad, a first signal pad, a first internal terminal pad and a second internal terminal pad are disposed on the front surface of the board body, and a second power pad, a second ground pad and a second signal pad are disposed on the back surface of the board body. The second power pad, the second ground pad and the second signal pad are electrically connected to the first power pad, the first ground pad and the first signal pad, respectively. An internal terminal interconnection is provided in a bulk region of the board body or on a surface of the board body. The internal terminal interconnection electrically connects the first internal terminal pad to the second internal terminal pad. A semiconductor package employing the package board is also provided.

49 Claims, 2 Drawing Sheets

(58) Field of Classification Search
USPC ..... 438/106, 108, 109; 257/678, 686, 697, 257/734
See application file for complete search history.

(56) References Cited

U.S. PATENT DOCUMENTS

| | | | | |
|---|---|---|---|---|
| 6,211,576 | B1 | 4/2001 | Shimizu et al. | |
| 6,362,525 | B1 * | 3/2002 | Rahim | 257/738 |
| 6,365,975 | B1 * | 4/2002 | DiStefano | H01L 23/498 257/685 |
| 6,400,576 | B1 * | 6/2002 | Davidson | 257/698 |
| 6,774,484 | B2 | 8/2004 | Mimino et al. | |
| 6,800,814 | B2 | 10/2004 | Ohsaka | |
| 6,800,947 | B2 * | 10/2004 | Sathe | 257/780 |
| 6,891,258 | B1 * | 5/2005 | Alexander et al. | 257/678 |
| 2002/0139571 | A1 * | 10/2002 | Mizunashi | 174/255 |
| 2005/0167811 | A1 * | 8/2005 | Frech et al. | 257/686 |
| 2005/0258532 | A1 * | 11/2005 | Yoshikawa et al. | 257/698 |
| 2007/0065981 | A1 * | 3/2007 | Okamoto et al. | 438/106 |

FOREIGN PATENT DOCUMENTS

| | | | |
|---|---|---|---|
| JP | 11-26638 | | 1/1999 |
| JP | H1126638 | A | 1/1999 |
| KR | 1994-0002980 | | 2/1994 |
| KR | 19940002980 | | 2/1994 |
| KR | 10-2003-0002421 | | 1/2003 |
| KR | 20030002421 | A | 1/2003 |
| KR | 2003-0069098 | | 8/2003 |
| KR | 20030069098 | A | 8/2003 |
| KR | 2003-0074158 | | 9/2003 |
| KR | 20030074158 | A | 9/2003 |

OTHER PUBLICATIONS

Norman Chang, "Challenges for Power, Signal, and Reliability Verification on 3D-IC/Silicon Interposer Designs", Apache Design, a subsidiary of ANSYS, ANSYS, Inc., Aug. 31, 2012, pp. 1-30.
English language abstract of Korean Publication No. 10-2003-0002421.

* cited by examiner

PACKAGE BOARD HAVING INTERNAL TERMINAL INTERCONNECTION AND SEMICONDUCTOR PACKAGE EMPLOYING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

[CROSS-REFERENCE TO RELATED APPLICATION] *CROSS REFERENCE*

[This application claims priority from Korean Patent Application No. 2006-5803, filed Jan. 19, 2006, the disclosure of which is hereby incorporated herein by reference in its entirety as if set forth fully herein.] *This application is a reissue of U.S. Pat. No. 7,745,922 issued on, Jun. 29, 2010, which claims priority from Korean Patent Application No. 2006-0005803, filed Jan. 19, 2006, the contents of which are herein incorporated by reference in their entirety.*

TECHNICAL FIELD

This disclosure relates to a package board and a semiconductor package employing the same and, more particularly, to a package board having an internal terminal interconnection and a semiconductor package employing the same.

BACKGROUND

A semiconductor device includes internal circuits that perform various functions using an external power voltage. The internal circuits may include some circuits, for example. high voltage circuits which use a different voltage from the external power voltage as an internal power voltage. The internal power voltage, i.e., a high voltage, for driving the high voltage circuits may be generated from a high voltage generator which is one of the internal circuits. In this case, chip level internal interconnections may be provided in the semiconductor device in order to electrically connect an output terminal of the high voltage generator to a power terminal of the high voltage circuits.

As the semiconductor device becomes more highly integrated, the pitch of the chip level internal interconnections has been reduced. Thus, there may be a limitation in stably supplying the internal power voltage to the high voltage circuit using only the chip level internal interconnections.

In addition, the semiconductor device may include so-called "redistributed" metal interconnections. The redistributed metal interconnections are provided to electrically connect chip pads, which are electrically connected with the internal circuits, to bonding pads. Effectively, the redistributed metal interconnections spatially redistribute, or reconfigure, the chip pads' first distribution of pad placements into a second distribution, or redistribution, having different, and generally more desirable, pad placements. The bonding pads correspond to pads which are in direct contact with solder bumps or bonding wires for package. Thus, by the "redistribution" of distributed chip pads to corresponding "redistributed" bonding pads, the redistributed bonding pads can be disposed at desired positions regardless of the positions or placements of the chip pads in the original distribution.

A semiconductor chip having the redistributed metal interconnections is taught in U.S. Pat. No. 6,211,576 B1 to Shimizu, et al., entitled "Semiconductor Device." According to Shimizu, et al., a power wiring section, a ground wiring section and a signal wiring section are provided at a same level, and the power wiring section or the ground wiring section is formed adjacent to both sides of at least a portion of the signal wiring section.

SUMMARY

In one embodiment, the present invention provides a package board that is suitable for improving internal power delivery efficiency and/or internal signal delivery efficiency between internal circuits in a semiconductor chip.

In another embodiment, the present invention also provides a semiconductor package employing a package board that is suitable for improving internal power delivery efficiency and/or internal signal delivery efficiency between internal circuits in a semiconductor chip.

According to an aspect of the present invention, the package board comprises a board body having a front surface and a back surface. A first power pad, a first ground pad, a first signal pad, a first internal terminal pad and a second internal terminal pad are provided on the front surface of the board body, and a second power pad, a second ground pad and a second signal pad are provided on the back surface of the board body. The second power pad, the second ground pad and the second signal pad are electrically connected to the first power pad, the first ground pad and the first signal pad, respectively. An internal terminal interconnection is provided in a bulk region of the board body or on a surface of the board body. The internal terminal interconnection electrically connects the first internal terminal pad to the second internal terminal pad.

In some embodiments of the present invention, the package board may further include a common power interconnection which is disposed in the bulk region of the board body or on the surface of the board body and electrically connected to the first and second power pads. The internal terminal interconnection may be disposed across the common power interconnection and electrically insulated from the common power interconnection.

In other embodiments, the package board may further include a common ground interconnection which is disposed in the bulk region of the board body or on the surface of the board body and electrically connected to the first and second ground pads. The internal terminal interconnection may be disposed across the common ground interconnection and electrically insulated from the common ground interconnection.

In still other embodiments, the first power pad, the first ground pad and the first signal pad may be electrically connected to the second power pad, the second ground pad and the second signal pad through first to third holes penetrating the board body, respectively.

According to another aspect of the present invention, the semiconductor package comprises a board body having a front surface and a back surface, and a semiconductor chip mounted on the front surface of the board body. A first power pad, a first ground pad, a first signal pad, a first internal terminal pad and a second internal terminal pad are provided on the front surface of the board body, and a second power pad, a second ground pad and a second signal pad are provided on the back surface of the board body. The second power pad, the second ground pad and the second signal pad are electrically connected to the first power pad, the first ground pad and the first signal pad, respectively. An internal terminal interconnection is formed in a bulk region of the board body or on a surface of the board body. The internal terminal interconnection electrically connects the first internal terminal pad to the second internal terminal pad. The semiconductor chip has an external power bonding pad, an external ground bonding pad, an external signal bonding pad, a first internal bonding pad and a second internal bonding pad. The first power pad, the first ground pad, the first signal pad, the first internal terminal pad and the second internal terminal pad are electrically connected to the external power bonding pad, the external ground bonding pad, the external signal bonding pad, the first internal bonding pad and the second internal bonding pad through an external power connector, an external ground connector, an external signal connector, a first internal connector and a second internal connector, respectively.

In some embodiments of the present invention, the semiconductor package may further include a common power interconnection which is disposed in the bulk region of the board body or on the surface of the board body and electrically connected to the first and second power pads.

In other embodiments, the semiconductor package may further include a common ground interconnection which is disposed in the bulk region of the board body or on the surface of the board body and electrically connected to the first and second ground pads.

In still other embodiments, the first power pad, the first ground pad and the first signal pad may be electrically connected to the second power pad, the second ground pad and the second signal pad through first to third holes penetrating the board body, respectively.

In yet other embodiments, the semiconductor package may further include a power ball, a ground ball and a signal ball that are in contact with the second power pad, the second ground pad and the second signal pad, respectively.

In yet still other embodiments, the first internal bonding pad may be electrically connected to an output terminal of an internal power generator of the semiconductor chip, and the second internal bonding pad may be electrically connected to a power terminal of any one of internal circuits of the semiconductor chip.

In further embodiments, the semiconductor chip may be a flip chip. In this case, the external power connector, the external ground connector, the external signal connector, the first internal connector and the second internal connector may be flip chip bumps.

In still further embodiments, the semiconductor chip may include a semiconductor substrate; internal circuits formed on the semiconductor substrate; an insulating layer covering the internal circuits and the semiconductor substrate; chip pads formed on the insulating layer and electrically connected to the internal circuits; a dielectric layer covering the insulating layer and the chip pads; and a power line, a ground line, a signal line, a first interconnection and a second interconnection redistributed on the dielectric layer. The chip pads may include an external power chip pad, an external ground chip pad, an external signal chip pad, a first internal chip pad and a second internal chip pad. The redistributed power line, the redistributed ground line, the redistributed signal line, the first interconnection and the second interconnection may be electrically connected to the external power chip pad, the external ground chip pad, the external signal chip pad, the first internal chip pad and the second internal chip pad, respectively. A portion of the redistributed power line, a portion of the redistributed ground line, a portion of the redistributed signal line, a portion of the first interconnection and a portion of the second interconnection may act as the external power bonding pad, the external ground bonding pad, the external signal bonding pad, the first internal bonding pad and the second internal bonding pad, respectively. An internal interconnection may be disposed on or in the insulating layer. The internal interconnection may electrically connect the first internal chip pad to the second internal chip pad. The internal circuits may constitute a DRAM circuit. The DRAM circuit may include a well bias circuit, a high voltage generator and a plate electrode voltage generator. One of the first internal chip pad and the second internal chip pad may be electrically connected to an output terminal of any one of the well bias circuit, the high voltage generator and the plate electrode voltage generator.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
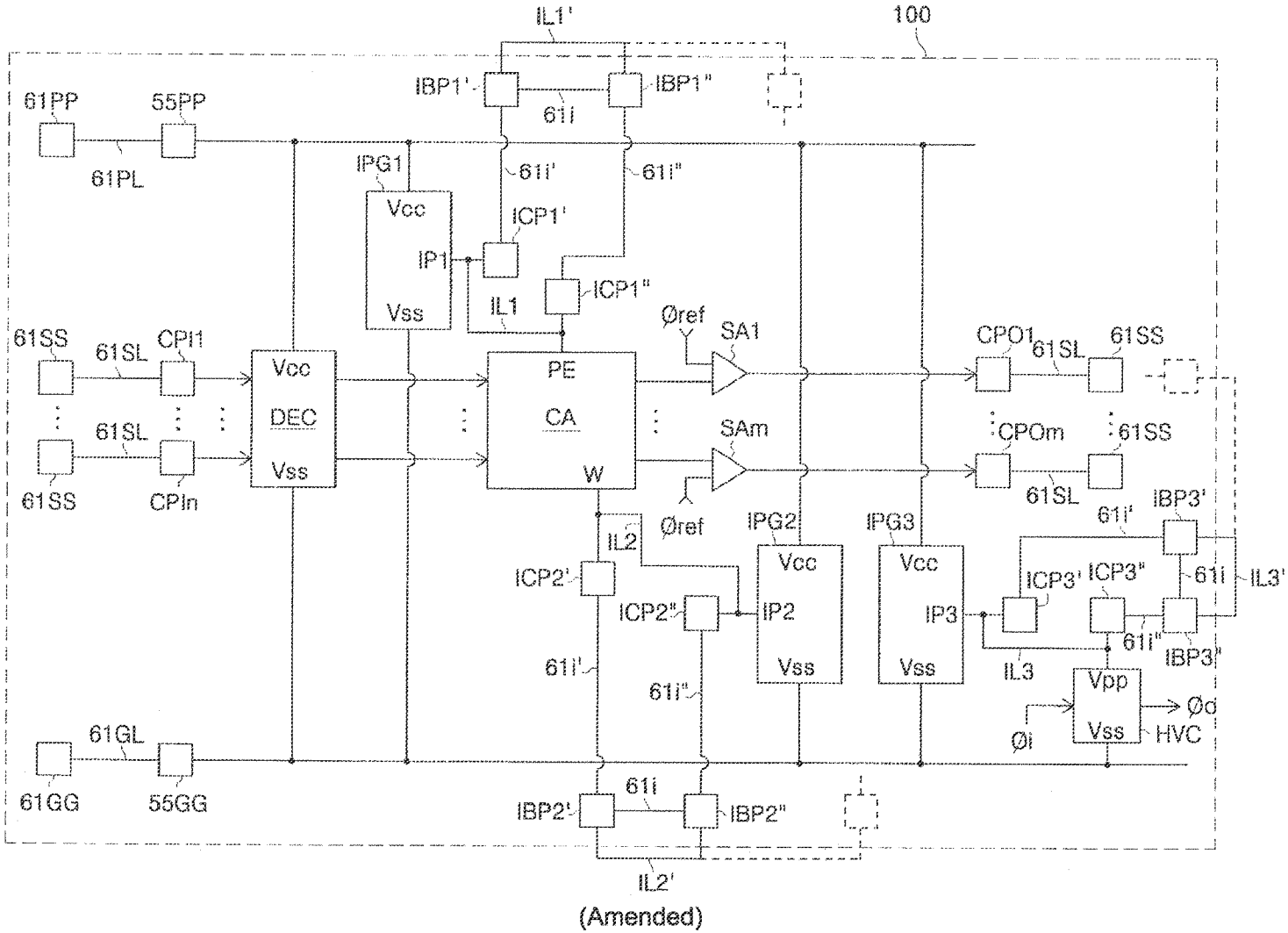
FIG. 1 is a schematic block diagram illustrating a DRAM chip employed in a semiconductor package according to an embodiment of the present invention and internal terminal interconnections connected to the DRAM chip.
Figure 2:
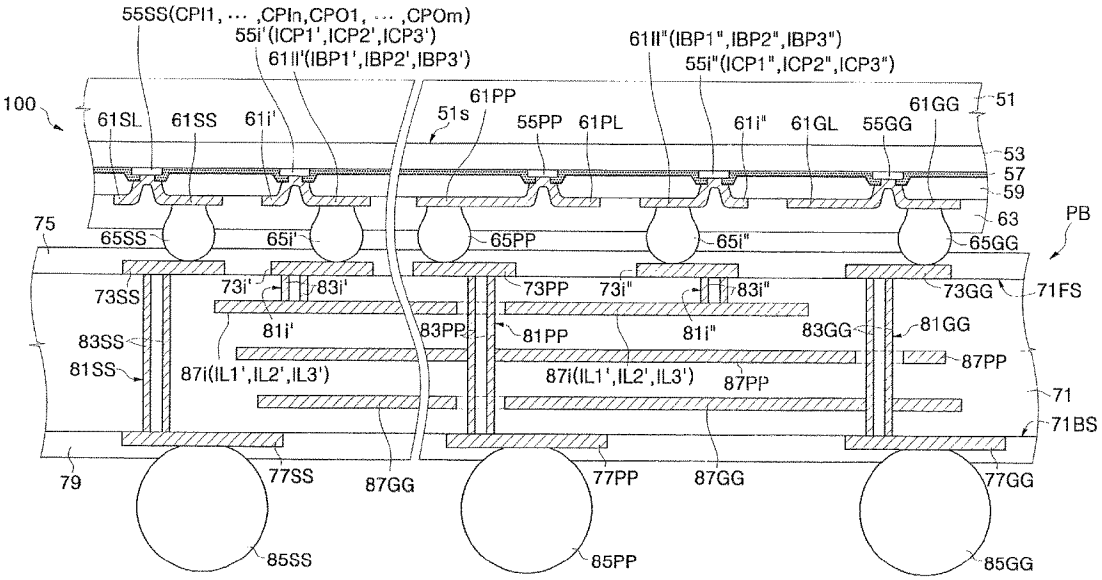
FIG. 2 is a cross-sectional view illustrating a semiconductor package according to an embodiment of the present invention.

FIG. 1 is a schematic block diagram illustrating a DRAM chip employed in a semiconductor package according to an embodiment of the present invention and internal terminal interconnections connected to the DRAM chip, and FIG. 2 is a cross-sectional view illustrating a DRAM package including the DRAM chip and the internal terminal interconnections of FIG. 1. However, the present invention is not limited to the DRAM package but may be applied to all semiconductor packages including an internal circuit which uses a different voltage from an external power voltage as an internal power voltage. For example, some embodiments of the present invention may be applicable to a package of a flash memory device including a high voltage generator and a high voltage circuit. The present invention may also be applied to all semiconductor packages having internal signal interconnections which electrically connect internal circuits with each other.

Referring to FIGS. 1 and 2, a DRAM chip 100 includes a plurality of chip pads. The chip pads can include an external power chip pad 55PP, an external ground chip pad 55GG, external signal chip pads, first internal chip pads and second internal chip pads. The external signal chip pads can include n input signal chip pads CPI1, . . . , CPIn and m output signal chip pads CPO1, . . . , CPOm.

The DRAM chip 100 can further include a plurality of internal circuits. For example, the DRAM chip 100 can include a cell array block CA having a plurality of DRAM cells, a decoder DEC for generating address signals to select at least one of the DRAM cells, and sense amplifiers SA1, . . . , SAm having first input terminals electrically connected to the selected DRAM cells. Each of the sense amplifiers SA1, . . . , SAm has a second input terminal to which a reference signal Φref is applied. The decoder DEC has a power terminal Vcc electrically connected to the external power chip pad 55PP and a ground terminal Vss electrically connected to the external ground chip pad 55GG. The input signal chip pads CPI1, . . . , CPIn are electrically connected to input terminals of the decoder DEC, respectively. The output signal chip pads CPO1, . . . , CPOm are electrically connected to output terminals of the sense amplifiers SA1, . . . , SAm, respectively.

The DRAM chip 100 can further include additional internal circuits such as first, second and third internal power generators IPG1, IPG2 and IPG3 as well as a high voltage circuit HVC. Each of the first, second and third internal power generators IPG1, IPG2 and IPG3 also has a power terminal Vcc electrically connected to the external power chip pad 55PP and a ground terminal Vss electrically connected to the external ground chip pad 55GG. The first, second and third internal power generators IPG1, IPG2 and IPG3 have first, second and third output terminals IP1, IP2 and IP3, respectively. The first internal power generator IPG1 outputs a first internal power voltage, which is applied to a plate electrode PE of the cell array block CA, through the first output terminal IP1. The second internal power generator IPG2 outputs a second internal power voltage, which is applied to a well region W of the cell array block CA, through the second output terminal IP2. The third internal power generator IPG3 outputs a third internal power voltage, which is applied to a power terminal Vpp of the high voltage circuit HVC, through the third output terminal IP3. Thus, the first, second and third internal power generators IPG1, IPG2 and IPG3 can correspond to a plate electrode voltage generator, a well bias circuit and a high voltage generator, respectively.

When the external power voltage applied to the power terminals Vcc is denoted by "$V_{DD}$", the first internal power voltage may be a half voltage of the external power voltage $V_{DD}$. Further, the second internal power voltage may be a negative voltage corresponding to a back gate bias of cell transistors in the cell array block CA. The third internal power voltage may be a positive high voltage which is greater than the external power voltage $V_{DD}$. Finally, the high voltage circuit HVC may be a high voltage logic circuit for converting a high voltage input signal Φi to a high voltage output signal Φo. These voltages are nominal and depend upon a particular application. Accordingly, any suitable voltages are contemplated as being within the spirit and scope of the invention.

The internal circuits such as the decoder DEC, the cell array block CA, the sense amplifiers SA1, . . . , SAm, the first through third internal power generators IPG1, . . . , IPG3 and the high voltage circuit HVC can be provided in or on the semiconductor substrate 51 of FIG. 2. A main surface 51s of the substrate having the internal circuits can be covered with an insulating layer 53.

The external power chip pad 55PP, the external ground chip pad 55GG and the external signal chip pads CPI1, . . . , CPIn and CPO1, . . . , CPOm (See 55SS of FIG. 2) are disposed on the insulating layer 53. In addition, first internal chip pads ICP1', ICP2' and ICP3' (See 55i' of FIG. 2) and second internal chip pads ICP1", ICP2" and ICP3" (See 55i" of FIG. 2) are disposed on the insulating layer 53. The first internal chip pads ICP1', ICP2' and ICP3' are electrically connected to the first, second and third output terminals IP1, IP2 and IP3, respectively. The second internal chip pads ICP1", ICP2" and ICP3" are electrically connected to the plate electrode PE, the well region W and the high voltage power terminal Vpp, respectively.

The first output terminal IP1 is electrically connected to the plate electrode PE through a first internal interconnection IL1 disposed in the insulating layer 53 or on the insulating layer 53. The second output terminal IP2 is electrically connected to the well region W through a second internal interconnection IL2 disposed in the insulating layer 53 or on the insulating layer 53. Further, the third output terminal IP3 is electrically connected to the high voltage power terminal Vpp through a third internal interconnection IL3 disposed in the insulating layer 53 or on the insulating layer 53. Those of skill in the art will appreciate that alternative suitable connections are within the spirit and scope of the invention.

The pitch size of the first, second and third internal interconnections IL1, IL2 and IL3 typically are subject to a design rule of the DRAM chip 100. Typically, the greater the integration density of the DRAM chip 100, the smaller the pitch size of the first, second and third internal interconnections IL1, IL2 and IL3. In other words, as the DRAM chip 100 becomes more highly integrated, electrical resistance of the internal interconnections IL1, IL2 and IL3 tends to increase, which, in turn, limits chip performance parameters such as access time and cycle time or even data read/write accuracy and reliability. Accordingly, there can be an undesirable limitation in attempting to improve delivery efficiency of internal power voltages of a highly integrated DRAM chip using the first, second and third internal interconnections IL1, IL2 and IL3.

It is this limitation and other problems that some embodiments of the present invention address. It will be seen that the invention supplies an additional and more robust connection between first and second internal terminal pads by disposing in or on a board body a thicker interconnect plane having higher pitched connection pads that effectively multiples the current carrying capacity (i.e., divides the resistance) of the conventional internal interconnections IL1, IL2 and IL3. Signal, power and ground electrical characteristics all similarly can be fortified in accordance with an embodiment of the invention. Those of skill in the art will appreciate that the power and ground interconnections preferably extend broadly in two dimensions across the plane of the board body like electrical shields, irrespective of which is disposed above and which is disposed below the internal terminal interconnection.

The chip pads 55PP, 55GG, 55SS, 55i' and 55i" and the insulating layer 53 are covered with a passivation layer 57. The passivation layer 57 can include a silicon nitride layer. The passivation layer 57 can be covered with a first dielectric layer 59. The first dielectric layer 59 may be a silicon oxide layer or a polyimide layer. In accordance with some embodiments of the invention, a redistributed power line 61PL, a redistributed ground line 61GL, a redistributed signal line 61SL, a first interconnection 61i' and a second interconnection 61i" may be provided on the first dielectric layer 59. The redistributed power line 61PL is electrically connected to the external power chip pad 55PP through a power via hole penetrating the first dielectric layer 59 and the passivation layer 57. Similarly, the redistributed ground line 61GL is electrically connected to the external ground chip pad 55GG through a ground via hole penetrating the first dielectric layer 59 and the passivation layer 57. Further, the redistributed signal line 61SL is electrically connected to the external signal chip pad 55SS through a signal via hole penetrating the first dielectric layer 59 and passivation layer 57. Similarly, the first interconnection 61i' is electrically connected to the first internal chip pad 55i' through a first via hole penetrating the first dielectric layer 59 and the passivation layer 57. Also similarly, the second interconnection 61i" is electrically connected to the second internal chip pad 55i" through a second via hole penetrating the first dielectric layer 59 and the passivation layer 57.

The redistributed power line 61PL, the redistributed ground line 61GL, the redistributed signal line 61SL, the first interconnection 61i', the second interconnection 61i" and the first dielectric layer 59 in accordance with some embodiments of the invention are covered with a second dielectric layer 63. The second dielectric layer 63 can be the same material layer as the first dielectric layer 59. A portion of the redistributed power line 61PL is exposed by a power via hole passing through the second dielectric layer 63 to serve as a power bonding pad 61PP, and a portion of the redistributed ground line 61GL is exposed by a ground via hole passing through the second dielectric layer 63 to serve as a ground bonding pad 61GG. Further, a portion of the redistributed signal line 61SL is exposed by a signal via hole passing through the second dielectric layer 63 to serve as a signal bonding pad 61SS. Similarly, a portion of the first interconnection 61i' is exposed by a first via hole passing through the second dielectric layer 63 to serve as a first internal bonding pad 61II' (IBP1', IBP2' or IBP3' of FIG. 1), and a portion of the second interconnection 61i" is exposed by a second via hole passing through the second dielectric layer 63 to serve as a second internal bonding pad 61" (IBP1", IBP2" or IBP3" of FIG. 1).

Those of skill in art will appreciate that alternative connections and exposures suitably can be used, as contemplated, within the spirit and scope of the invention. Similarly, alternative interconnection means suitably can be used. For example, flex circuit boards and/or through-hole solder junction posts or the like can be used, within the spirit and scope of the invention, to form the needed or desired interconnections.

The bonding pads 61PP, 61GG, 61SS, 61II' and 61II" advantageously are disposed at desired positions regardless of positions of the chip pads 55PP, 55GG, 55SS, 55i' and 55i". This is because of the presence of the redistributed power line 61PL, the redistributed ground line 61GL, the redistributed signal line 61SL, the first interconnection 61i' and the second interconnection 61i" described and illustrated herein as forming a part of the present invention.

In accordance with an alternative embodiment of the present invention, the redistributed power line 61PL, the redistributed ground line 61GL, the redistributed signal line 61SL, the first interconnection 61i' and the second interconnection 61i" may not be provided, i.e., they are omitted. In this case, the chip pads 55PP, 55GG, 55SS, 55i' and 55i" will be understood by those of skill in the art to act as bonding pads.

In accordance with yet another embodiment, the first and second interconnections 61i' and 61i" may extend to act as a redistributed internal interconnection (61i of FIG. 1) electrically connecting the first internal bonding pad 61II' to the second internal bonding pad 61II". Notwithstanding the presence of the redistributed internal interconnection 61i, there nevertheless is a limitation by way of a reduction in the electrical resistance of the redistributed internal interconnection 61i. This is because the redistributed power line 61PL, the redistributed ground line 61GL and the redistributed signal line 61SL occupy a wide area. That is, it may be difficult to efficiently lay out the redistributed internal interconnection 61i together with the redistributed power line 61PL, the redistributed ground line 61GL and the redistributed signal line 61SL. As a result, even though the internal interconnections IL1, IL2 and IL3 and the redistributed internal interconnections 61i are provided, there might be a practical limitation in improving power delivery efficiency when conveying output voltages of the first, second and third internal power generators IPG1, IPG2 and IPG3 to the corresponding internal circuits.

The DRAM chip 100 can be mounted on a package board PB. The package board PB includes a board body 71 having a front surface 71FS and a back surface 71BS. When the DRAM chip 100 is provided for a flip chip package, the DRAM chip 100 is mounted on the package board PB so that the bonding pads 61PP, 61GG, 61SS, 61II' and 61II" face the front surface 71FS of the package board PB, as shown in FIG. 2.

A first power pad 73PP, a first ground pad 73GG, a first signal pad 73SS, a first internal terminal pad 73i' and a second internal terminal pad 73i", which correspond to the bonding pads 61PP, 61GG, 61SS, 61II' and 61II" respectively, are provided on the front surface 71FS. The external power bonding pad 61PP, the external ground bonding pad 61GG, the external signal bonding pad 61SS, the first internal bonding pad 61II' and the second internal bonding pad 61II" are electrically connected to the first power pad 73PP, the first ground pad 73GG, the first signal pad 73SS, the first internal terminal pad 73i' and the second internal terminal pad 73i" via an external power connector 65PP, an external ground connector 65GG, an external signal connector 65SS, a first internal connector 65i' and a second internal connector 65i", respectively. When the DRAM chip 100 is a flip chip as described above, the connectors 65PP, 65GG, 65SS, 65i' and 65i" typically take the form of bumps, as shown in FIG. 2. The bumps, i.e., flip chip bumps, can include solder bumps or gold stud bumps. Those of skill in the art will appreciate that alternative embodiments are contemplated, such that alternative interconnection schemes involving more or fewer of different interconnections and more or fewer or different terminal and intermediate connection pads, i.e., termini, are contemplated as being within the spirit and scope of the invention, The first power pad 73PP, the first ground pad 73GG, the first signal pad 73SS, the first internal terminal pad 73i', the second internal terminal pad 73i" and the front surface 71FS may be covered with a first coating layer 75 that comprises an insulating material. In this case, the solder bumps 65PP, 65GG, 65SS, 65i' and 65i" may be seen to penetrate the first coating layer 75, thereby to be in contact with the first power pad 73PP, the first ground pad 73GG, the first signal pad 73SS, the first internal terminal pad 73i' and the second internal terminal pad 73i", respectively.

A second power pad 77PP, a second ground pad 77GG and a second signal pad 77SS are provided on the back surface 71BS. The second power pad 77PP, the second ground pad 77GG, the second signal pad 77SS and the back surface 71BS may be covered with a second coating layer 79. The second coating layer 79 may be of the same material layer as the first coating layer 75, although within the spirit and scope of the invention it can be different. The second power pad 77PP, the second ground pad 77GG and the second signal pad 77SS may be seen to be in contact with a power ball 85PP, a ground ball 85GG and a signal ball 85SS passing through the second coating layer 79, respectively.

The first power pad 73PP is electrically connected to the second power pad 77PP via a first conductive line 83PP provided in a first hole 81PP passing through the board body 71, and the first ground pad 73GG is electrically connected to the second ground pad 77GG via a second conductive line 83GG provided in a second hole 81GG passing through the board body 71. Similarly, the first signal pad 73SS is electrically connected to the second signal pad 77SS via a third conductive line 83SS provided in a third hole 81SS passing through the board body 71. Those of skill in the art will appreciate that these connections are contemplated as being typical, although alternative connections are contemplated as being within the spirit and scope of the invention.

An internal terminal interconnection 87i is provided in a bulk region of the board body 71. A first region of the internal terminal interconnection 87i is electrically connected to the first internal terminal pad 73i' via a first hole interconnection 83i' provided in a first interconnection hole 81i' in the board body 71, and a second region of the internal terminal interconnection 87i is electrically connected to the second internal terminal pad 73i" via a second hole interconnection 83i" provided in a second interconnection hole 81i" in the board body 71. As a result, the internal terminal interconnection 87i electrically connects the first internal terminal pad 73i' to the second internal terminal pad 73i".

In another embodiment, the internal terminal interconnection 87i can be provided on the surface of the board body 71. The internal terminal interconnection 87i can correspond to any one of first, second and third internal terminal interconnections IL1', IL2' and IL3', which electrically connect the first internal bonding pads IBP1', IBP2' and IBP3' (FIG. 1) to the second internal bonding pads IBP1", IBP2" and IBP3", respectively.

The internal terminal interconnection 87i may be provided in the bulk region of the board body 71 or on the surface thereof, as described above. As a result, the internal terminal interconnection 87i (providing at least first and second internal terminal pads 731' and 73i" that define therebetween a so-called interconnection pitch or pitch size) can be configured to provide a greater pitch size than that of any other interconnections in the DRAM chip 100. This is helpful because the number of the interconnections provided in the package board PB typically is much less than the number of the interconnections disposed in the DRAM chip 100. In addition, the internal terminal interconnections 87i may have a greater thickness than the interconnections in the DRAM chip 100. Accordingly, the electrical resistance of the internal terminal interconnections 87i may be significantly reduced relative to the electrical resistance of the internal interconnections IL1, IL2 and IL3 and the redistributed internal interconnection 61i.

A common power interconnection 87PP and a common ground interconnection 87GG additionally are provided in the board body 71, in accordance with one embodiment of the invention. The common power interconnection 87PP is electrically connected to the first power pad 73PP via a first conductive line 83PP, and the common ground interconnection 87GG is electrically connected to the first ground pad 73GG via a second conductive line 83GG. Alternatively, the common power interconnection 87PP and the common ground interconnection 87GG may be provided on the surface of the board body 71. The common power interconnection 87PP can be electrically connected to other external power pads (not shown) of the DRAM chip 100, and the common ground interconnection 87GG can be electrically connected to other external ground pads (not shown) of the DRAM chip 100. The internal terminal interconnection 87i can be disposed across the common power interconnection 87PP (when viewed from a plan view) and electrically insulated from the common power interconnection 87PP. Similarly, the internal terminal interconnection 87i can be disposed across the common ground interconnection 87GG (when viewed from a plan view) and electrically insulated from the common ground interconnection 87GG.

According to some embodiments of the present invention as described above, internal terminal interconnections are provided in the package board or on the package board, and the internal terminal interconnections are electrically connected to a first internal circuit, which may be electrically coupled to the first internal bonding pads 61II', and to a second internal circuit, which may be electrically coupled to the second internal bonding pads 61II", of a semiconductor chip mounted on the package board. Thus, it is possible to improve power delivery efficiency and/or signal delivery efficiency between the first and second internal circuits.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It is further intended that any other embodiments of the present invention that result from any changes in application or method of use or operation, method of manufacture, shape, size, or material which are not specified within the detailed written description or illustrations contained herein yet are considered apparent or obvious to one skilled in the art are within the scope of the present invention.

Accordingly, while the present invention has been shown and described with reference to the foregoing embodiments of the invented apparatus, it will be apparent to those skilled in the art that other changes in form and detail may be made therein without departing from the spirit and scope of the invention as defined in the appended claims.

What is claimed is:

[1. A package board comprising:

a board body having a front surface and a back surface;

a first power pad, a first ground pad, a first signal pad, a first internal terminal pad and a second internal terminal pad disposed on the front surface of the board body;

a second power pad, a second ground pad and a second signal pad disposed on the back surface of the board body, the second power pad, the second ground pad and the second signal pad being electrically connected to the first power pad, the first ground pad and the first signal pad, respectively; and an internal terminal interconnection disposed in a bulk region of the board body or on a surface of the board body to electrically connect the first internal terminal pad to the second internal terminal pad, wherein the first internal terminal pad and the second internal terminal pad are electrically insulated from the first power pad, the first ground pad and the first signal pad.]

[2. The package board according to claim 1, further comprising a common power interconnection disposed in the bulk region of the board body or on the surface of the board body and electrically connected to the first and second power pads.]

[3. The package board according to claim 2, wherein the internal terminal interconnection is disposed across the common power interconnection and electrically insulated from the common power interconnection.]

[4. The package board according to claim 1, further comprising a common ground interconnection disposed in the bulk region of the board body or on the surface of the board body and electrically connected to the first and second ground pads.]

[5. The package board according to claim 4, wherein the internal terminal interconnection is disposed across the common ground interconnection and electrically insulated from the common ground interconnection.]

[6. The package board according to claim 1, wherein the first power pad, the first ground pad and the first signal pad are electrically connected to the second power pad, the second ground pad and the second signal pad, respectively, through first, second and third holes penetrating the board body.]

[7. The package board according to claim 1, wherein the first internal terminal pad and the second internal terminal pad are directly connected to a first internal bonding pad and a second internal bonding pad of a semiconductor chip to be mounted on the front surface of the board body.]

[8. The package board according to claim 2, wherein the internal terminal interconnection and the common power interconnection are electrically insulated from each other.]

[9. The package board according to claim 1, wherein the first internal terminal pad and the second internal terminal pad are only disposed on the front surface of the board body.]

[10. A semiconductor package comprising:

a board body having a front surface and a back surface;

a first power pad, a first ground pad, a first signal pad, a first internal terminal pad and a second internal terminal pad disposed on the front surface of the board body;

a second power pad, a second ground pad and a second signal pad disposed on the back surface of the board body, the second power pad, the second ground pad and the second signal pad being electrically connected to the first power pad, the first ground pad and the first signal pad, respectively;

a power ball, a ground ball and a signal ball that are in contact with the second power pad, the second ground pad and the second signal pad, respectively;

an internal terminal interconnection disposed in a bulk region of the board body or on a surface of the board body to electrically connect the first internal terminal pad to the second internal terminal pad;

a semiconductor chip mounted on the front surface of the board body, the semiconductor chip having an external power bonding pad, an external ground bonding pad, an external signal bonding pad, a first internal bonding pad and a second internal bonding pad; and an external power connector, an external ground connector, an external signal connector, a first internal connector and a second internal connector electrically connecting the first power pad, the first ground pad, the first signal pad, the first internal terminal pad and the second internal terminal pad to the external power bonding pad, the external ground bonding pad, the external signal bonding pad, the first internal bonding pad and the second internal bonding pad, respectively, wherein the first internal terminal pad and the second internal terminal pad are electrically insulated from the first power pad, the first ground pad and the first signal pad.]

[11. The package according to claim 10, further comprising a common power interconnection disposed in the bulk region of the board body or on the surface of the board body and electrically connected to the first and second power pads.]

[12. The package according to claim 10, further comprising a common ground interconnection disposed in the bulk region of the board body or on the surface of the board body and electrically connected to the first and second ground pads.]

[13. The package according to claim 10, wherein the first power pad, the first ground pad and the first signal pad are electrically connected to the second power pad, the second ground pad and the second signal pad, respectively, through first, second and third holes penetrating the board body.]

[14. The package according to claim 10, wherein the first internal bonding pad is electrically connected to an output terminal of an internal power generator of the semiconductor chip, and wherein the second internal bonding pad is electrically connected to a power terminal of any one of one or more internal circuits of the semiconductor chip.]

[15. The package according to claim 10, wherein the semiconductor chip is a flip chip.]

[16. The package according to claim 15, wherein the external power connector, the external ground connector, the external signal connector, the first internal connector and the second internal connector are flip chip bumps.]

[17. The semiconductor package according to claim 11, wherein the first internal connector and the second internal connector are electrically insulated from the common power interconnection.]

[18. A semiconductor package comprising:

a board body having a front surface and a back surface;

a first power pad, a first ground pad, a first signal pad, a first internal terminal pad and a second internal terminal pad disposed on the front surface of the board body;

a second power pad, a second ground pad and a second signal pad disposed on the back surface of the board body, the second power pad, the second ground pad and the second signal pad being electrically connected to the first power pad, the first ground pad and the first signal pad, respectively;

a power ball, a ground ball and a signal ball that are in contact with the second power pad, the second ground pad and the second signal pad, respectively;

an internal terminal interconnection disposed in a bulk region of the board body or on a surface of the board body to electrically connect the first internal terminal pad to the second internal terminal pad;

a semiconductor chip mounted on the front surface of the board body, the semiconductor chip having an external power bonding pad, an external ground bonding pad, an external signal bonding pad, a first internal bonding pad and a second internal bonding pad; and an external power connector, an external ground connector, an external signal connector, a first internal connector and a second internal connector electrically connecting the first power pad, the first ground pad, the first signal pad, the first internal terminal pad and the second internal terminal pad to the external power bonding pad, the external ground bonding pad, the external signal bonding pad, the first internal bonding pad and the second internal bonding pad, respectively, wherein the semiconductor chip comprises:

a semiconductor substrate;

internal circuits formed at the semiconductor substrate;

an insulating layer covering the internal circuits and the semiconductor substrate;

an external power chip pad, an external ground chip pad, an external signal chip pad, a first internal chip pad and a second internal chip pad disposed on the insulating layer and electrically connected to the internal circuits;

a dielectric layer covering the insulating layer and the chip pads; and a power line, a ground line, a signal line, a first interconnection and a second interconnection redistributed on the dielectric layer and electrically connected to the external power chip pad, the external ground chip pad, the external signal chip pad, the first internal chip pad and the second internal chip pad, respectively, wherein a portion of the redistributed power line, a portion of the redistributed ground line, a portion of the redistributed signal line, a portion of the first interconnection and a portion of the second interconnection correspond to the external power bonding pad, the external ground bonding pad, the external signal bonding pad, the first internal bonding pad and the second internal bonding pad, respectively.]

[19. The package according to claim 18, further comprising an internal interconnection disposed on or in the insulating layer, wherein the internal interconnection electrically connects the first internal chip pad to the second internal chip pad.]

[20. The package according to claim 18, wherein the one or more internal circuits are configured as a DRAM circuit.]

[21. The package according to claim 20, wherein the DRAM circuit comprises a well bias circuit, a high voltage generator and a plate electrode voltage generator.]

[22. The package according to claim 21, wherein one of the first internal chip pad and the second internal chip pad is electrically connected to an output terminal of any one of the well bias circuit, the high voltage generator and the plate electrode voltage generator.]

[23. The package according to claim 18, further comprising a redistributed internal interconnection provided on the dielectric layer to electrically connect the first internal bonding pad to the second internal bonding pad.]

*24. A semiconductor package comprising:*

*a package board comprising:*

*a board body having a front surface and a back surface;*

*a first power pad, a first ground pad, a first signal pad, and at least three internal terminal pads disposed on the front surface of the board body, the at least three internal terminal pads being configured to provide an internal power delivery function;*

*a second power pad, a second ground pad and a second signal pad disposed on the back surface of the board body, the second power pad, the second ground pad and the second signal pad being electrically connected to the first power pad, the first ground pad and the first signal pad, respectively; and*

*an internal terminal interconnection disposed in a bulk region of the board body or on the front surface of the board body to electrically connect the at least three internal terminal pads; and*

*a semiconductor chip mounted on the package board and including an internal power generator and an internal circuit,*

*wherein:*

*the at least three internal terminal pads are electrically insulated from remaining pads configured to provide a function other than the internal power delivery function, the remaining pads including the first power pad, the first ground pad, the first signal pad, the second power pad, the second ground pad and the second signal pad,*

*the internal terminal interconnection is connected to the semiconductor chip through the at least three internal terminal pads,*

*one of the at least three internal terminal pads is electrically connected to an output terminal of the internal power generator,*

*another of the at least three internal terminal pads is electrically connected to a power terminal of the internal circuit,*

*the internal terminal interconnection is not electrically connected with conductive elements disposed on the back surface of the board body,*

*the semiconductor chip further comprises an internal interconnection electrically connecting the output terminal of the internal power generator and the power terminal of the internal circuit through a path fully within the semiconductor chip, and*

*a thickness of the internal terminal interconnection is greater than a thickness of the internal interconnection.*

*25. The semiconductor package of claim 24, wherein the internal terminal interconnection is physically connected to the semiconductor chip through the at least three internal terminal pads.*

*26. The semiconductor package of claim 24, wherein the at least three internal terminal pads are electrically connected to at least three internal bonding pads of the semiconductor chip.*

*27. The semiconductor package of claim 24, wherein the at least three internal terminal pads are disposed only on the front surface of the board body.*

*28. The semiconductor package of claim 24, wherein the internal terminal interconnection is configured to receive internal power from the internal power generator in the semiconductor chip.*

*29. The semiconductor package of claim 24, further comprising:*

*a first conductive line straightly passing through the board body to connect the first power pad to the second power pad;*

*a second conductive line straightly passing through the board body to connect the first ground pad to the second ground pad; and*

*a third conductive line straightly passing through the board body to connect the first signal pad to the second signal pad.*

*30. The semiconductor package of claim 24, wherein the internal terminal interconnection does not encircle any of the at least three internal terminal pads.*

*31. The semiconductor package of claim 24, wherein the internal terminal interconnection does not have a spiral geometry.*

*32. The semiconductor package of claim 24, wherein the internal terminal interconnection does not operate as an inductor.*

*33. The semiconductor package of claim 24, wherein the internal terminal interconnection circumvents other conductive structures when connecting between the at least three internal terminal pads.*

*34. A semiconductor package comprising:*

*a package board comprising:*

*a board body having a front surface and a back surface;*

*a first power pad, a first ground pad, a first signal pad, and at least three internal terminal pads disposed on the front surface of the board body, the at least three internal terminal pads that include a first internal terminal pad and a second internal terminal pad being configured to provide an internal power delivery function;*

*a second power pad, a second ground pad and a second signal pad disposed on the back surface of the board body, the second power pad, the second ground pad and the second signal pad being electrically connected to the first power pad, the first ground pad and the first signal pad, respectively; and*

*an internal terminal interconnection disposed in a bulk region of the board body or on the front surface of the board body to electrically connect the first internal terminal pad to the second internal terminal pad; and*

*a semiconductor chip mounted on the package board and including an internal power generator and an internal circuit,*

*wherein:*

*the at least three internal terminal pads are electrically insulated from the first power pad, the first ground pad and the first signal pad,*

*the internal terminal interconnection is connected to the semiconductor chip through the at least three internal terminal pads,*

*the internal terminal interconnection is not electrically connected with conductive elements disposed on the back surface of the board body,*

*the at least three internal terminal pads include a first internal terminal pad and a second internal terminal pad,*

*the first internal terminal pad is electrically connected to an output terminal of the internal power generator,*

*the second internal terminal pad is electrically connected to a power terminal of the internal circuit,*

*the internal terminal interconnection does not operate as an inductor,*

*the semiconductor chip further comprises an internal interconnection electrically connecting the output terminal of the internal power generator and the power terminal of the internal circuit through a path fully within the semiconductor chip, and*

*a thickness of the internal terminal interconnection is greater than a thickness of the internal interconnection.*

*35. The semiconductor package of claim 34, wherein the internal terminal interconnection is configured to receive internal power from the internal power generator.*

*36. The semiconductor package of claim 34, wherein the internal terminal interconnection does not encircle any of the at least three internal terminal pads.*

*37. The semiconductor package of claim 34, wherein the internal terminal interconnection does not have a spiral geometry.*

*38. The semiconductor package of claim 34, wherein the internal terminal interconnection circumvents other conductive structures when connecting between the at least three internal terminal pads.*

*39. A semiconductor device comprising:*

*a package board comprising:*

*a board body having a front surface and a back surface;*

*a first power pad, a first ground pad, a first signal pad, and at least three internal terminal pads disposed on the front surface of the board body;*

*a second power pad, a second ground pad and a second signal pad disposed on the back surface of the board body, the second power pad, the second ground pad and the second signal pad being electrically connected to the first power pad, the first ground pad and the first signal pad, respectively; and*

*an internal terminal interconnection disposed in a bulk region of the board body or on the front surface of the board body to electrically connect the at least three internal terminal pads, the at least three internal terminal pads being electrically insulated from the first power pad, the first ground pad and the first signal pad; and*

*a semiconductor chip mounted on the package board and including an internal power generator and an internal circuit,*

*wherein:*

*the internal terminal interconnection is connected to the semiconductor chip through the at least three internal terminal pads; and*

*the internal terminal interconnection is not electrically connected with conductive elements disposed on the back surface of the board body,*

*the internal terminal interconnection does not encircle any of the at least three internal terminal pads,*

*a power terminal of the internal circuit is electrically connected to one of the at least three internal terminal pads,*

*the internal power generator is electrically connected to another of the at least three internal terminal pads,*

*the internal power generator outputs an internal power voltage through an output terminal which is applied to the internal circuit,*

*the internal terminal interconnection does not have a spiral geometry,*

*the semiconductor chip further comprises an internal interconnection electrically connecting the output terminal of the internal power generator and the power terminal of the internal circuit through a path fully within the semiconductor chip, and*

*a thickness of the internal terminal interconnection is greater than a thickness of the internal interconnection.*

*40. The semiconductor device of claim 39, wherein the internal terminal interconnection does not operate as an inductor.*

*41. The semiconductor device of claim 39, wherein the internal terminal interconnection circumvents other conductive structures when connecting between the at least three internal terminal pads.*

*42. The semiconductor device of claim 39, wherein the internal terminal interconnection does not have any shielding lines extending in parallel with the internal terminal interconnection.*

*43. The semiconductor device of claim 39, wherein the internal terminal interconnection horizontally extends to directly connect one of the at least three internal terminal pads with another of the at least three internal terminal pads.*

*44. The semiconductor device of claim 39, wherein no interconnections are sides of the internal terminal interconnection between one of the at least three internal terminal*

*pads and another of the at least three internal terminal pads so that the internal terminal interconnection has a single line.*

*45. The semiconductor device of claim 39, further comprising:*

*a common ground interconnection disposed in the bulk region of the board body and electrically connected to the first and second ground pads,*

*wherein the internal terminal interconnection is disposed at a level different than the common ground interconnection so that the front surface of the board body is closer to the internal terminal interconnection than the common ground interconnection.*

*46. A semiconductor package comprising:*

*a package board including:*

*a board body having a front surface and a back surface;*

*a first power pad, a first ground pad, a first signal pad, a first internal terminal pad and a second internal terminal pad disposed on the front surface of the board body, the first and second internal terminal pads being configured to provide an internal power delivery function;*

*a second power pad, a second ground pad and a second signal pad disposed on the back surface of the board body, the second power pad, the second ground pad and the second signal pad being electrically connected to the first power pad, the first ground pad and the first signal pad, respectively; and*

*an internal terminal interconnection disposed in a bulk region of the board body or on the front surface of the board body to electrically connect the first internal terminal pad and the second internal terminal pad; and*

*a semiconductor chip mounted on the package board, and including an internal power generator, an internal circuit, a first internal chip pad and a second internal chip pad,*

*wherein:*

*the first internal terminal pad is electrically connected to the first internal chip pad,*

*the second internal terminal pad is electrically connected to the second internal chip pad,*

*the first and second internal terminal pads are electrically insulated from the first power pad, the first ground pad and the first signal pad,*

*the first internal chip pad is electrically connected to an output terminal of the internal power generator,*

*the second internal chip pad is electrically connected to a power terminal of the internal circuit,*

*the semiconductor chip further comprises an internal interconnection electrically connecting the output terminal of the internal power generator and the power terminal of the internal circuit through a path fully within the semiconductor chip, and*

*a thickness of the internal terminal interconnection is greater than a thickness of the internal interconnection.*

*47. The semiconductor package of claim 46, wherein the semiconductor package includes a flash memory.*

*48. The semiconductor package of claim 46, wherein the internal terminal interconnection is not electrically connected with conductive elements disposed on the back surface of the board body.*

*49. The semiconductor package of claim 46, wherein the internal terminal interconnection does not have a spiral geometry.*

*50. The semiconductor package of claim 46, wherein the internal terminal interconnection does not operate as an inductor.*

*51. The semiconductor package of claim 46, wherein the internal terminal interconnection circumvents other conductive structures when connecting between the first internal terminal pad and the second internal terminal pad.*

*52. The semiconductor package of claim 46, wherein the internal terminal interconnection does not encircle the first and second internal terminal pads.*

*53. A semiconductor package comprising:*

*a package board including:*

*a board body having a front surface and a back surface;*

*a first power pad, a first ground pad, a first signal pad, a first internal terminal pad and a second internal terminal pad disposed on the front surface of the board body, the first and second internal terminal pads being configured to provide an internal power delivery function;*

*a second power pad, a second ground pad and a second signal pad disposed on the back surface of the board body, the second power pad, the second ground pad and the second signal pad being electrically connected to the first power pad, the first ground pad and the first signal pad, respectively; and*

*an internal terminal interconnection disposed in a bulk region of the board body or on the front surface of the board body to electrically connect the first internal terminal pad and the second internal terminal pad; and*

*a semiconductor chip mounted on the package board, and including an internal power generator, an internal circuit, a first internal chip pad and a second internal chip pad,*

*wherein:*

*the first internal terminal pad is electrically connected to the first internal chip pad,*

*the second internal terminal pad is electrically connected to the second internal chip pad,*

*the first internal chip pad is electrically connected to an output terminal of the internal power generator,*

*the second internal chip pad is electrically connected to a power terminal of the internal circuit,*

*the first and second internal terminal pads are electrically insulated from the first power pad, the first ground pad and the first signal pad,*

*the internal terminal interconnection is not electrically connected with conductive elements disposed on the back surface of the board body,*

*the semiconductor chip further comprises an internal interconnection electrically connecting the output terminal of the internal power generator and the power terminal of the internal circuit through a path fully within the semiconductor chip, and*

*a thickness of the internal terminal interconnection is greater than a thickness of the internal interconnection.*

*54. The semiconductor package of claim 53, wherein the semiconductor package includes a flash memory.*

*55. The semiconductor package of claim 53, wherein the internal terminal interconnection does not have a spiral geometry.*

*56. The semiconductor package of claim 53, wherein the internal terminal interconnection does not operate as an inductor.*

*57. The semiconductor package of claim 53, wherein the internal terminal interconnection circumvents other conductive structures when connecting between the first internal terminal pad and the second internal terminal pad.*

*58. The semiconductor package of claim 53, wherein the internal terminal interconnection does not encircle the first and second internal terminal pads.*

*59. A semiconductor package comprising:*

*a package board including:*

*a board body having a front surface and a back surface;*

*a first power pad, a first ground pad, a first signal pad, a first internal terminal pad and a second internal terminal pad disposed on the front surface of the board body, the first and second internal terminal pads being configured to provide an internal power delivery function;*

*a second power pad, a second ground pad and a second signal pad disposed on the back surface of the board body, the second power pad, the second ground pad and the second signal pad being electrically connected to the first power pad, the first ground pad and the first signal pad, respectively; and*

*an internal terminal interconnection disposed in a bulk region of the board body or on the front surface of the board body to electrically connect the first internal terminal pad and the second internal terminal pad; and*

*a semiconductor chip mounted on the package board, and including an internal power generator, an internal circuit, a first internal chip pad and a second internal chip pad,*

*wherein:*

*the first internal terminal pad is electrically connected to the first internal chip pad,*

*the second internal terminal pad is electrically connected to the second internal chip pad,*

*the first and second internal terminal pads are electrically insulated from the first power pad, the first ground pad and the first signal pad,*

*the first internal chip pad is electrically connected to an output terminal of the internal power generator, and*

*the second internal chip pad is electrically connected to a power terminal of the internal circuit,*

*the internal power generator outputs an internal power voltage which is applied to the internal circuit,*

*the internal terminal interconnection does not have a spiral geometry,*

*the semiconductor chip further comprises an internal interconnection electrically connecting the output terminal of the internal power generator and the power terminal of the internal circuit through a path fully within the semiconductor chip; and*

*a thickness of the internal terminal interconnection is greater than a thickness of the internal interconnection.*

*60. The semiconductor package of claim 59, wherein the semiconductor package includes a flash memory.*

*61. The semiconductor package of claim 59, wherein the internal terminal interconnection does not operate as an inductor.*

*62. The semiconductor package of claim 59, wherein the internal terminal interconnection circumvents other conductive structures when connecting between the first internal terminal pad and the second internal terminal pad.*

*63. The semiconductor package of claim 59, wherein the internal terminal interconnection does not encircle the first and second internal terminal pads.*

*64. A semiconductor device comprising:*

*a package board including:*

*a board body having a front surface and a back surface;*

*a first power pad, a first ground pad, a first signal pad, a first internal terminal pad and a second internal terminal pad disposed on the front surface of the board body, the first and second internal terminal pads being configured to provide an internal power delivery function;*

*a second power pad, a second ground pad and a second signal pad disposed on the back surface of the board body, the second power pad, the second ground pad and the second signal pad being electrically connected to the first power pad, the first ground pad and the first signal pad, respectively; and*

*an internal terminal interconnection disposed in a bulk region of the board body or on the front surface of the board body to electrically connect the first internal terminal pad and the second internal terminal pad; and*

*a semiconductor chip mounted on the package board, and including a first internal power generator, a second internal power generator, a first internal circuit, a second internal circuit, a first internal chip pad and a second internal chip pad,*

*wherein:*

*the first internal terminal pad is electrically connected to the first internal chip pad,*

*the second internal terminal pad is electrically connected to the second internal chip pad,*

*the first and second internal terminal pads are electrically insulated from the first power pad, the first ground pad and the first signal pad,*

*the first internal chip pad is electrically connected to an output terminal of the first internal power generator,*

*the second internal chip pad is electrically connected to an output terminal of the second internal power generator,*

*the output terminal of the first internal power generator is electrically connected to a power terminal of the first internal circuit,*

*the output terminal of the second internal power generator is electrically connected to a power terminal of the second internal circuit,*

*the semiconductor chip further comprises a first internal interconnection electrically connecting the output terminal of the first internal power generator and the power terminal of the first internal circuit through a path fully within the semiconductor chip,*

*the semiconductor chip further comprises a second internal interconnection electrically connecting the output terminal of the second internal power generator and the power terminal of the second internal circuit through a path fully within the semiconductor chip, and*

*a thickness of the internal terminal interconnection is greater than a thickness of the first and second internal interconnections.*

*65. The semiconductor device of claim 64, further comprising a flash memory.*

*66. The semiconductor device of claim 64, wherein the internal terminal interconnection is not electrically connected with conductive elements disposed on the back surface of the board body.*

*67. The semiconductor device of claim 64, wherein the internal terminal interconnection does not have a spiral geometry.*

*68. The semiconductor device of claim 64, wherein the internal terminal interconnection does not operate as an inductor.*

*69. The semiconductor device of claim 64, wherein the internal terminal interconnection circumvents other conductive structures when connecting between the first internal terminal pad and the second internal terminal pad.*

*70. The semiconductor device of claim 64, wherein the internal terminal interconnection does not encircle the first and second internal terminal pads.*

*71. The semiconductor device of claim 64, wherein the first and second internal terminal pads are electrically insulated from the first power pad, the first ground pad and the first signal pad.*

*72. The semiconductor device of claim 64, wherein the internal terminal interconnection does not have any shielding lines extending in parallel with the internal terminal interconnection.*

* * * * *